United States Patent
Ahn et al.

(10) Patent No.: US 7,166,519 B2
(45) Date of Patent: Jan. 23, 2007

(54) METHOD FOR ISOLATING SEMICONDUCTOR DEVICES WITH USE OF SHALLOW TRENCH ISOLATION METHOD

(75) Inventors: Sang-Tae Ahn, Ichon-shi (KR); Dong-Sun Sheen, Ichon-shi (KR); Seok-Pyo Song, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 125 days.

(21) Appl. No.: 10/866,618

(22) Filed: Jun. 12, 2004

(65) Prior Publication Data

US 2005/0142795 A1    Jun. 30, 2005

(30) Foreign Application Priority Data

Dec. 29, 2003    (KR)    ........................ 10-2003-0098428

(51) Int. Cl.
*H01L 21/76*    (2006.01)
*H01L 21/469*    (2006.01)

(52) U.S. Cl. ...................... 438/400; 438/424; 438/405; 438/435; 438/637; 438/770; 438/769; 438/787; 438/790; 257/E21.548

(58) Field of Classification Search ................ 438/400, 438/435, 424, 436, 437, 296, 405, 637, 770, 438/769, 787, 790
See application file for complete search history.

(56) References Cited

U.S. PATENT DOCUMENTS

| | | | |
|---|---|---|---|
| 6,734,082 B1 * | 5/2004 | Zheng et al. | 438/435 |
| 2001/0006839 A1 * | 7/2001 | Yeo | 438/435 |
| 2003/0030121 A1 * | 2/2003 | Heo et al. | 257/499 |
| 2003/0190800 A1 * | 10/2003 | Lee et al. | 438/637 |

FOREIGN PATENT DOCUMENTS

| | | |
|---|---|---|
| KR | 1020010058498 | 7/2001 |
| KR | 1020030013761 | 2/2003 |

* cited by examiner

*Primary Examiner*—Michael Lebentritt
*Assistant Examiner*—Mohsen Ahmadi
(74) *Attorney, Agent, or Firm*—Blakely Sokoloff Taylor & Zafman (57) ABSTRACT

The present invention relates to a method for isolating semiconductor devices. The method includes the steps of: forming a patterned pad nitride layer pattern to open at least one isolation region on the substrate; forming a first trench and a second trench by etching the exposed substrate; depositing a first oxide layer to fill the first trench by performing an atomic layer deposition (ALD) method; etching a portion of the first oxide layer which is filled into the wide trench; and depositing a second oxide layer by performing a deposition method.

11 Claims, 6 Drawing Sheets

METHOD FOR ISOLATING SEMICONDUCTOR DEVICES WITH USE OF SHALLOW TRENCH ISOLATION METHOD

FIELD OF THE INVENTION

The present invention relates to a method for forming a semiconductor device; and, more particularly, to a method for isolating semiconductor devices on a semiconductor substrate with use of a shallow trench isolation method.

DESCRIPTION OF RELATED ARTS

As known, a device isolation technology has been employed to electrically isolate individual devices such as transistors and capacitors during fabrication of a semiconductor integration circuit. Among various methods of the device isolation technology, a local oxidation of silicon (LOCOS) method and a shallow trench isolation (STI) method are commonly adopted.

The LOCOS method forms a nitride layer-based mask pattern on an active region of a silicon substrate and thermally oxidating the silicon substrate with use of the mask pattern as a mask. Although the LOCOS method is a simple oxidation process as described above, the LOCOS method is disadvantageous that an oxide layer is formed in a wide area and a bird's beak phenomenon occurs at an interfacial surface between the oxide layer and the silicon substrate because of a lateral oxidation during the thermal oxidation process. Particularly, the bird's beak phenomenon is a cause for degrading a gate oxide layer and reducing an area of an active region.

Because of these disadvantages, it is limited to apply the LOCOS method to highly integrated devices. As a result of this limitation, the STI method is more widely employed. Specifically, the STI method forms a device isolation region by forming a shallow trench in a substrate and then burying an oxide layer into the trench. These serial steps of the STI method make it possible to solve the above described problems related to the LOCOS method. Therefore, the STI method is applied to form a device isolation structure in highly integrated devices, e.g., a dynamic random access memory device with 256 megabytes.

Figure 1:
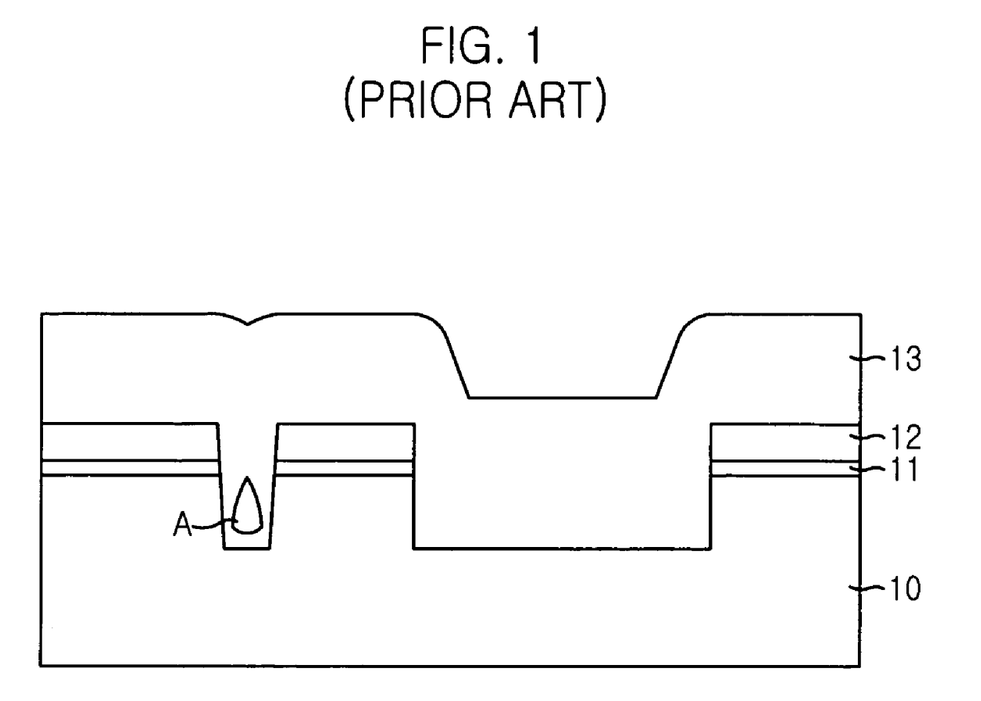
FIG. 1 is a cross-sectional view of a semiconductor device obtained after an oxide layer for filling a trench is deposited by performing a conventional shallow trench isolation (STI) method.

FIG. 1 is a cross-sectional view of a semiconductor device obtained after an oxide layer for filling a trench is deposited by performing a conventional STI method.

As shown, a pad oxide layer 11 and a nitride layer 12 are formed on a substrate 10, and trenches are formed by performing an etching process with use of a device isolation mask. Subsequently, an oxide layer 13 is deposited into the trench and is subjected to a chemical mechanical polishing (CMP) process. Afterwards, the nitride layer 12 and the pad oxide layer 11 are removed.

In the above STI method, a chemical vapor deposition (CVD) method is commonly used to deposit the oxide layer 13. However, in case of a micro-trench gap-filling, the oxide layer 13 is deposited by performing a high density plasma (HDP)—CVD method.

Typically, device isolation regions, i.e., field oxidation regions, in a semiconductor device are defined in a wide area and a relatively shallow area. Especially, in a DRAM memory device with several gigabytes, a device isolation region in a cell array region is needed to be defined in a shallow area, while a device isolation region in a peripheral circuit region is needed to be defined in a wide area.

However, in a gigabyte level DRAM memory device having a trench defined with a depth of about 0.25 µm and a width less than about 0.1 µm, voids are formed within this micro-trench even if an oxide layer is filled into the micro-trench with use of a HDP-CVD method. FIG. 1 shows the above-explained void, which is denoted with the reference symbol A.

In the Korean Laid-Open No. 2001-0058498 disclosed on Jul. 6, 2001, entitled "Method for Forming Trench Type Isolation Layer of Semiconductor Device," the entire contents of which being incorporated hereby reference, an oxide layer for use in a trench burial is deposited into trenches by performing an atomic layer deposition (ALD) method which has an excellent step coverage property.

Figure 2:
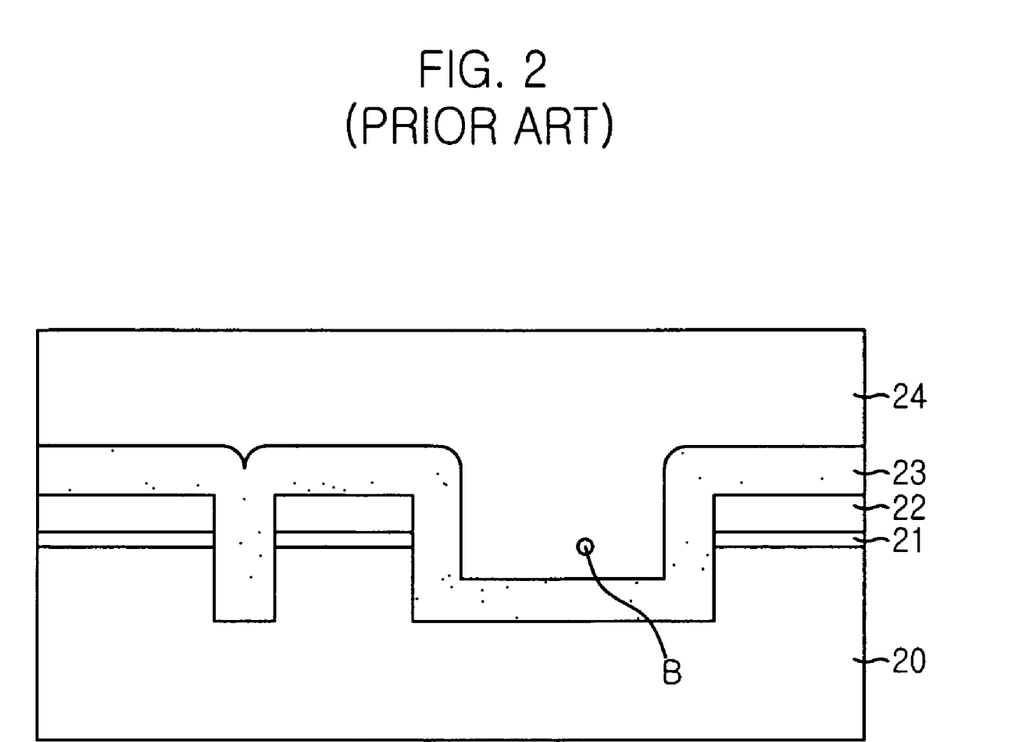
FIG. 2 is a cross-sectional view of a semiconductor device obtained after an oxide layer for filling a trench is deposited by performing another conventional STI method.

FIG. 2 is a cross-sectional view for describing another conventional method for depositing an oxide layer for use in a trench burial into trenches.

As shown, a pad oxide layer 21 and a nitride layer 22 are formed on a substrate 20, and trenches are formed by performing an etching process with use of a device isolation mask. A first oxide layer 23 is then formed with such a thickness to fill a micro-trench. At this time, the first oxide layer 23 is formed by employing an ALD method. A second oxide layer 24 is consecutively deposited by performing a HDP-CVD method. At this time, the second oxide layer 24 is deposited until completely filling the wide trench.

The reason for consecutively performing the HDP-CVD method after the ALD method is because the HDP-CVD method has an advantage in product yields compared to the ALD method which requires a long deposition time for the trench burial.

However, even in this conventional method, a void denoted as B in FIG. 2 might be generated in the wide trench during the HDP-CVD method because the wide trench becomes narrow in its width due to the ALD deposition of the first oxide layer 23.

Next, the nitride layer 32 and the pad oxide layer 31 are patterned by performing an etching process with use of a device isolation mask, thereby obtaining a patterned nitride layer 32A and a patterned pad oxide layer 31A. The nitride layer 32 is formed by performing a low pressure chemical vapor deposition (LP-CVD) method until reaching a thickness ranging from approximately 10 Å to approximately 200 Å. Then, exposed portions of the substrate 30 are etched with a thickness ranging from about 2000 Å to about 4000 Å. As shown in FIG. 3B, there is a micro-trench 33A formed in a cell region and a wide trench 33B formed in a peripheral circuit region.

SUMMARY OF THE INVENTION

It is, therefore, an object of the present invention to provide a method for isolating semiconductor devices with use of a shallow trench isolation method capable of preventing generation of voids within both of a micro-trench and a wide trench.

In accordance with an aspect of the present invention, there is provided a method for isolating devices on a substrate by forming a trench, including the steps of: forming a patterned pad nitride layer pattern to open at least one isolation region on the substrate; forming a first trench and a second trench by etching the exposed substrate; depositing a first oxide layer to fill the first trench by performing an atomic layer deposition (ALD) method; etching a portion of the first oxide layer which is filled into the wide trench; and depositing a second oxide layer by performing a deposition method.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a preferred embodiment of the present invention will be described in detail with reference to the accompanying drawings.

FIGS. 3A to 3G show cross-sectional views of a semiconductor device for describing a method for forming a STI structure in accordance with a preferred embodiment of the present invention.

Figure 3A:
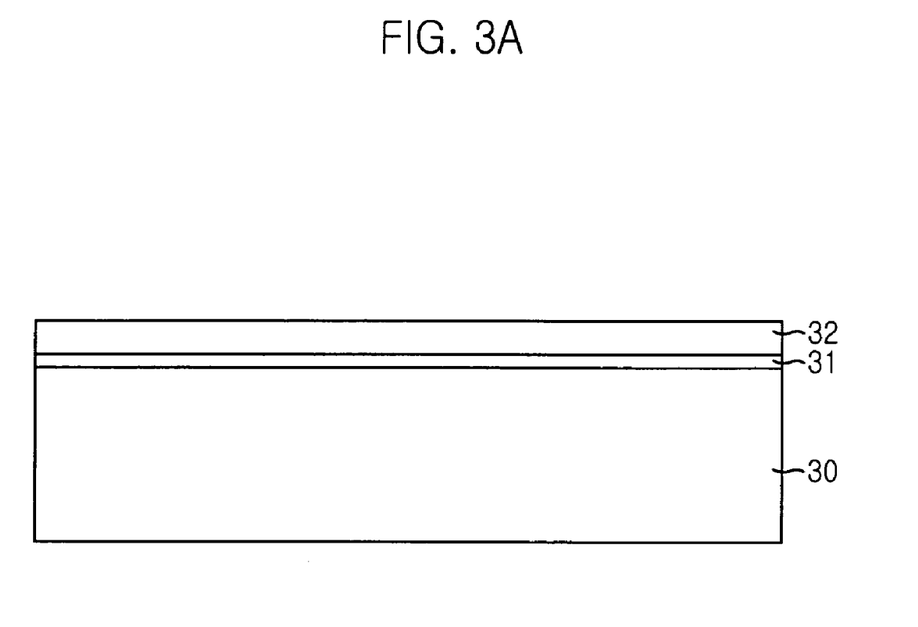
FIGS. 3A to 3G are cross-sectional views of a semiconductor device for describing a method for forming a STI structure in accordance with a preferred embodiment of the present invention.
Figure 3B:
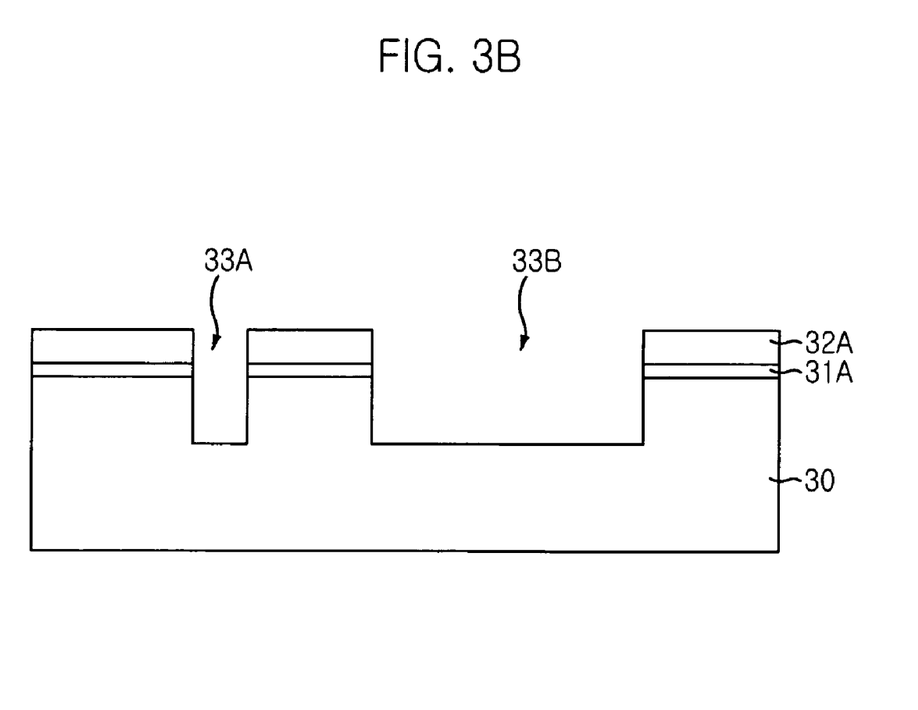

Referring to FIG. 3A, a pad oxide layer 31 is formed on a substrate 30 with a thickness ranging from about 25 Å to about 200 Å. Then, a nitride layer 32 is deposited on the pad oxide layer 31 with a thickness ranging from about 1000 Å to about 2000 Å.

Next, the nitride layer 32 and the pad oxide layer 31 are patterned by performing an etching process with use of a device isolation mask, thereby obtaining a patterned nitride layer 32A and a patterned pad oxide layer 31A. Then, exposed portions of the substrate 30 are subjected to a dry etching process to thereby form trenches. At this time, the exposed portions of the substrate 30 are etched with a thickness ranging from about 2000 Å to about 4000 Å. As shown in FIG. 3B, there are a micro-trench 33A formed in a cell region and a wide trench 33B formed in a peripheral circuit region.

Figure 3C:
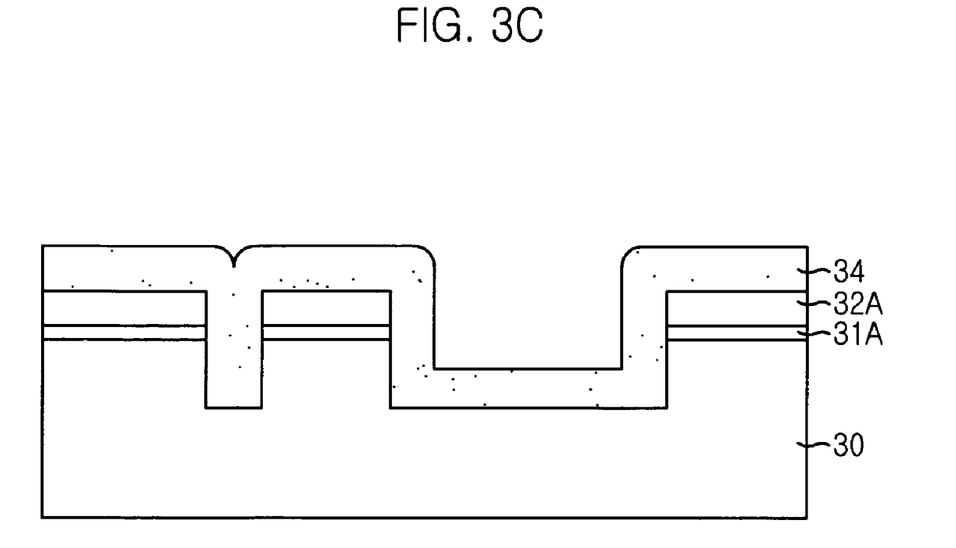

Subsequently, a first oxide layer 34 is deposited by performing an atomic layer deposition (ALD) method such that the first oxide layer 34 fills the micro-trench 33A. The first oxide layer 34 is formed with a thickness, which is greater than about one half of a thickness required by the design rule, so that the first oxide layer 34 completely fills the micro-trench 33A in the cell region.

Preferably, the thickness of the first oxide layer 34 ranges from about 300 Å to about 500 Å. Also, the first oxide layer 34 is formed by repeating a cycle of alternately providing a source gas of silicon selected from a group of $Si_xCl_y$, such as silicon tetrachloride ($SiCl_4$) and disilicon hexachloride ($Si_2Cl_6$) and an oxygen source gas such as water ($H_2O$) and hydrogen peroxide ($H_2O_2$) into a reaction chamber.

Herein, the subscripts x representing an atomic ratio of silicon is in a range from about 1 to about 4, while the subscript y representing an atomic ratio of chloride is in a range from about 1 to about 8. Particularly, the fist oxide layer 34 is deposited at a temperature preferably ranging from about 20° C. to about 400° C. Moreover, it is possible to add one of pyridine ($C_5H_5N$) and ammonia ($NH_3$) as a catalyst to decrease a reaction activation energy level during the deposition of the first oxide layer 34.

It is also preferred that the first oxide layer 34 is treated with a thermal process for the purpose of densification. The thermal process is generally carried out at a temperature ranging from about 500° C. to about 1200° C. in an atmosphere selected from a gas group consisting of hydrogen ($H_2$), oxygen ($O_2$), nitrogen ($N_2$), ozone ($O_3$) and nitrous oxide ($N_2O$) and mixed $H_2$ and $O_2$ for more than 5 minutes. However, the thermal process in this preferred embodiment adopts a rapid thermal process (RTP) carried out at a temperature greater than about 600° C. for about more than 5 seconds.

Meanwhile, it is possible to perform a lateral oxidation process prior to depositing the first oxide layer 34 in order to eliminate damaged portions of the substrate 30 caused by the etching process for forming the micro-trench 33A and the wide trench 33B and to improve interfacial characteristics. Also, a liner oxide layer and/or a liner nitride layer can be formed. At this time, the liner nitride layer serves as an etch stop layer when the first oxide layer 34 is etched. The liner oxide layer is formed on the substrate 30 by a thermal oxidation process in order to minimize the deposition thickness of the first oxide layer 34.

Figure 3D:
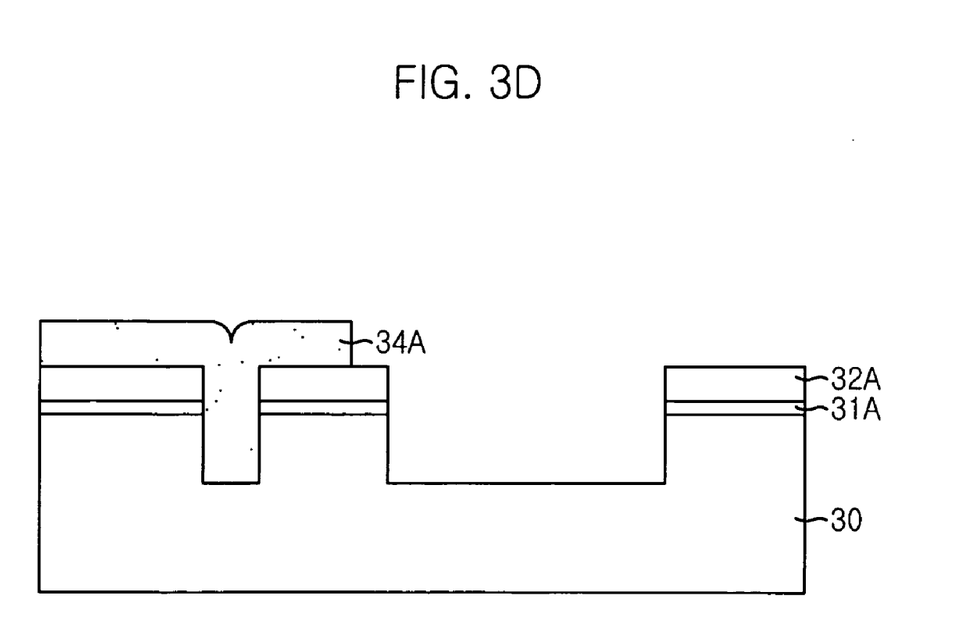

Referring to FIG. 3D, a region in which the micro-trench 33A is formed in the cell array region is masked, while a region in which the wide trench 33B is formed in the peripheral circuit region is opened. Then, the first oxide layer 34 formed in this opened region is etched by employing a wet and/or dry etching process, thereby obtaining a patterned first oxide layer 34A.

Figure 3E:
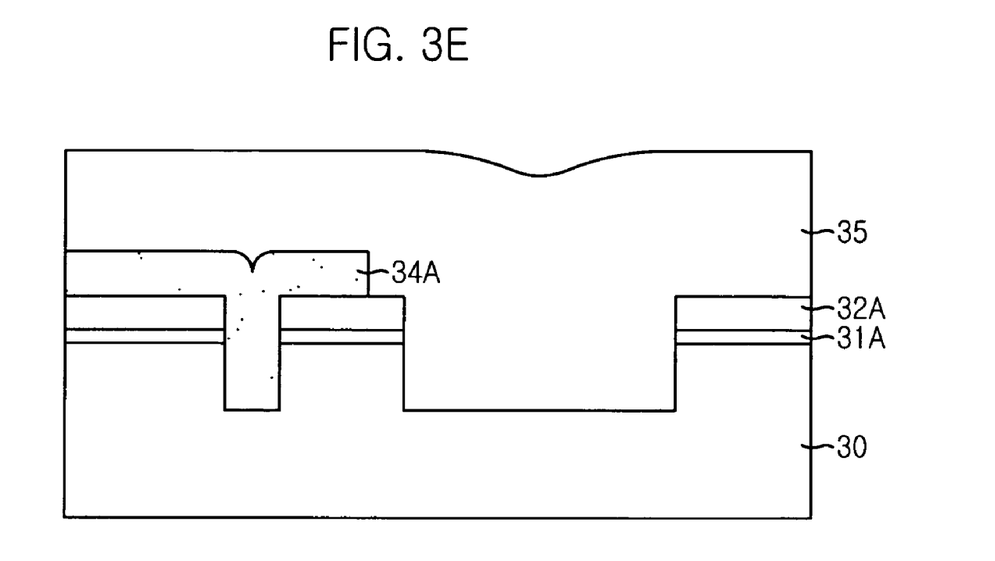

Referring to FIG. 3E, a second oxide layer 35 is formed on an entire surface of the above resulting structure by performing a high density plasma-chemical vapor deposition (HDP-CVD) method with use of a reaction gas of silane ($SiH_4$). The second oxide layer 35 has a thickness greater than each depth of the micro-trench 33A and the wide trench 33B. That is, the thickness of the second oxide layer 35 is greater than about 5000 Å. Instead of using the HDP-CVD oxide layer, it is also possible to employ an undoped silicon glass (USG) layer deposited by performing one of atmospheric pressure (AP)—CVD method and a sub-atmospheric (SA)-CVD method with use of a reaction gas of tetraethylorthosilicate (TEOS).

Figure 3F:
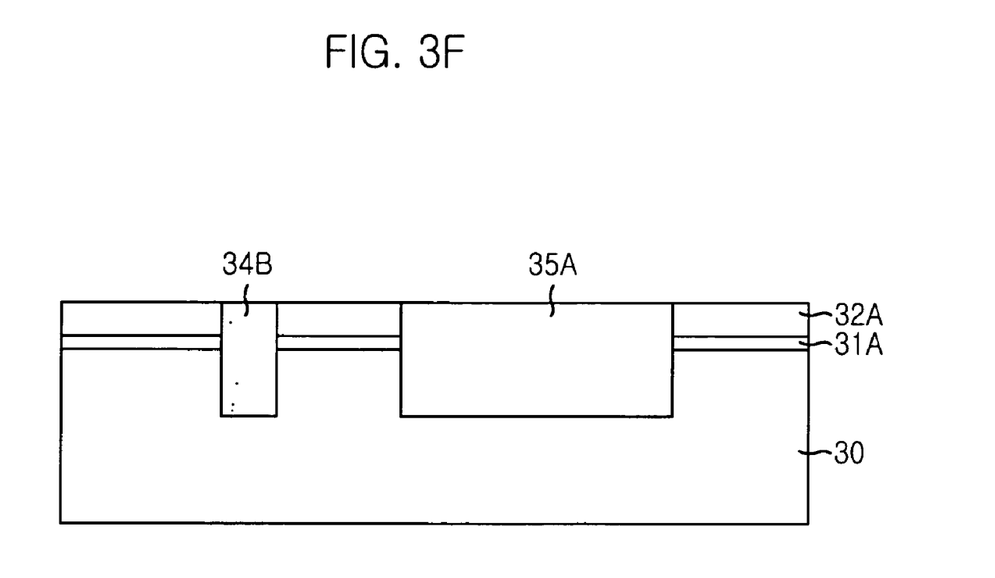

Referring to FIG. 3F, a chemical mechanical polishing (CMP) process is performed to the second oxide layer 35 and the patterned first oxide layer 34A shown in FIG. 3E by using the patterned nitride layer 32A as a CMP stop layer. The CMP process planarizes the patterned first oxide layer 34A and the second oxide layer 35 until the top surface of the patterned nitride layer 32A is exposed, thereby respectively providing a planarized first oxide layer 34B and a planarized second oxide layer 35A.

Figure 3G:
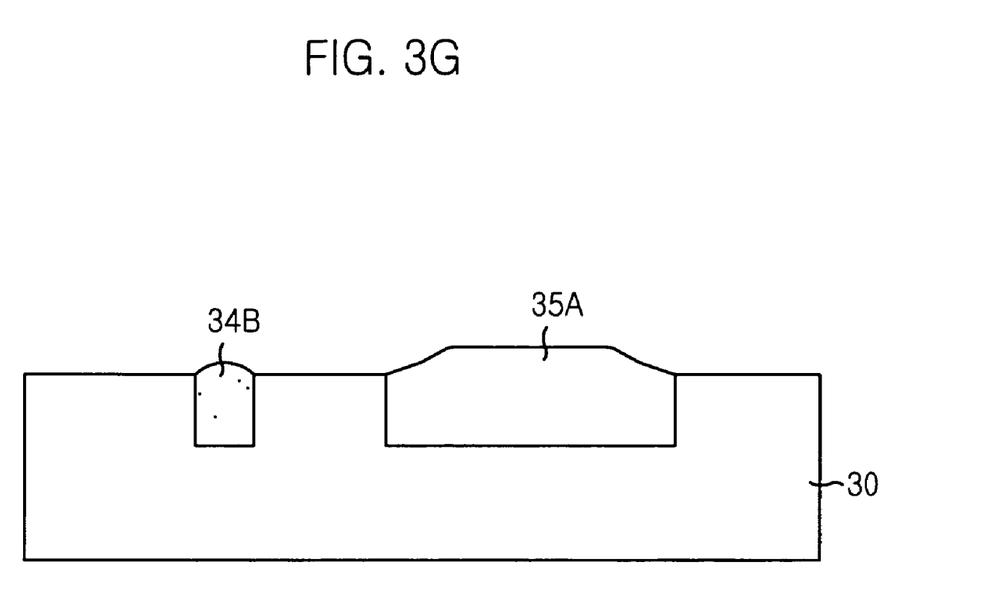

Referring to FIG. 3G, the exposed patterned nitride layer 32A and the patterned pad oxide layer 31A are removed by a wet etching process, and other typical subsequent processes are performed to complete the device isolation process.

On the basis of the above-described preferred embodiment, it is possible to improve device reliability by preventing generation of voids in the first and the second oxide layers for use in the trench burial. Also, an increase in depth and a decrease in width of the trench lead to an improvement on a scale of device integration. Furthermore, the use of the insulation layer formed in the cell array region through the ALD method which dose not use a plasma, i.e., the first oxide layer, makes it possible to minimize damages to the substrate, thereby improving a refresh characteristic.

The present application contains subject matter related to the Korean patent application No. KR 2003-0098428, filed in the Korean Patent Office on Dec. 29, 2003, the entire contents of which being incorporated herein by reference.

While the present invention has been described with respect to certain preferred embodiments, it will be apparent to those skilled in the art that various changes and modifications may be made without departing from the scope and spirit of the invention as defined in the following claims.

What is claimed is:

1. A method for isolating devices on a substrate by forming a trench, comprising the steps of:
    forming a patterned pad nitride layer to open at least one isolation region on the substrate;
    forming a first trench and a second trench by etching the exposed substrate;
    depositing a first oxide layer to fill the first trench and the second trench by performing an atomic layer deposition (ALD) method, wherein one of pyridine and ammonia is used as a catalyst for lowering a reaction activation energy level;
    etching a whole portion of the first oxide layer filled into the second trench; and
    depositing a second oxide layer in the second trench by performing a deposition method after etching the whole portion of the first oxide layer in the second trench.

2. The method of claim 1, wherein the deposition method has a higher deposition rate than the ALD method does to thereby completely fill the second trench with the second oxide layer.

3. The method of claim 1, further includes the step of:
    forming an etch stop layer on the substrate prior to depositing the first oxide layer.

4. The method of claim 3, wherein the etch stop layer is a liner nitride layer.

5. The method of claim 3, wherein the etch stop layer is formed by performing a low pressure chemical vapor deposition (LP-CVD) method until reaching a thickness ranging from approximately 10 Å to approximately 200 Å.

6. The method of claim 4, wherein the etch stop layer is formed by performing a LP-CVD method until reaching a thickness ranging from approximately 10 Å to approximately 200 Å.

7. The method of claim 1, wherein prior to depositing the first oxide layer, a third oxide layer is formed on the substrate by a thermal oxidation process in order to minimize the deposition thickness of the first oxide layer.

8. The method of claim 1, wherein the first oxide layer is formed by repeatedly performing a cycle of providing alternately a source gas of silicon selected from a group of $Si_xCl_y$, where x representing an atomic ratio of silicon is in a range from approximately 1 to approximately 4 and y representing an atomic ratio of chlorine is in a range from approximately 1 to approximately 8, and a source gas of oxygen into a reaction chamber.

9. The method of claim 1, wherein after the deposition of the first oxide layer, a thermal process is performed to densify the first oxide layer.

10. The method of claim 2, wherein the second oxide layer is deposited by performing one of a high density plasma (HDP)-CVD method, an atmospheric pressure (AP)-CVD method and a sub-atmospheric (SA)-CVD method.

11. The method of claim 1, wherein a width of the second trench is greater than that of the first trench.

* * * * *

UNITED STATES PATENT AND TRADEMARK OFFICE
CERTIFICATE OF CORRECTION

| | | |
|---|---|---|
| PATENT NO. | : 7,166,519 B2 | Page 1 of 1 |
| APPLICATION NO. | : 10/866618 | |
| DATED | : January 23, 2007 | |
| INVENTOR(S) | : Ahn et al. | |

It is certified that error appears in the above-identified patent and that said Letters Patent is hereby corrected as shown below:

Title Page
In Item [56], References Cited, Foreign Patent Documents, please insert
-- JP 2000-269210  9-29-2000  Toshiba Corp. --.

Signed and Sealed this

Twenty-first Day of August, 2007

JON W. DUDAS
*Director of the United States Patent and Trademark Office*